(12) United States Patent
Kitada

(10) Patent No.: US 9,245,942 B2
(45) Date of Patent: Jan. 26, 2016

(54) COMPOSITE SUBSTRATE, ELECTRONIC COMPONENT, AND METHOD OF MANUFACTURING COMPOSITE SUBSTRATE AND ELECTRONIC COMPONENT

(75) Inventor: Masanobu Kitada, Kyoto (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 172 days.

(21) Appl. No.: 14/001,411

(22) PCT Filed: Feb. 27, 2012

(86) PCT No.: PCT/JP2012/054796
§ 371 (c)(1),
(2), (4) Date: Aug. 23, 2013

(87) PCT Pub. No.: WO2012/115269
PCT Pub. Date: Aug. 30, 2012

(65) Prior Publication Data
US 2013/0328048 A1    Dec. 12, 2013

(30) Foreign Application Priority Data
Feb. 25, 2011    (JP) .................................. 2011-039334

(51) Int. Cl.
*H01L 29/24*    (2006.01)
*H01L 29/04*    (2006.01)
(Continued)

(52) U.S. Cl.
CPC .......... *H01L 29/04* (2013.01); *H01L 21/02433* (2013.01); *H01L 21/2007* (2013.01); *H01L 29/02* (2013.01)

(58) Field of Classification Search
CPC .................. H01L 2924/00; H01L 2924/0132; H01L 2224/48227; H01L 2924/00014; H01L 2924/01079; H01L 2924/0105; H01L 2224/48465; H01L 2924/01029; H01L 2924/01046; H01L 2224/29111; H01L 2224/2919
See application file for complete search history.

(56) References Cited

U.S. PATENT DOCUMENTS 6,423,614 B1    7/2002    Doyle
6,524,935 B1    2/2003    Canaperi et al.
(Continued)

FOREIGN PATENT DOCUMENTS

JP    64077951 A    3/1989
JP    1012547 A    1/1998
(Continued)

OTHER PUBLICATIONS

Extended European Search Report, European Patent Appln. No. 12750048.6, Aug. 18, 2014, 6 pp.
Summary of Rejections from Japanese Patent Application No. 2012524029, Jun. 18, 2013, 5 pp.
(Continued)

*Primary Examiner* — Robert Bachner
(74) *Attorney, Agent, or Firm* — Volpe and Koenig, P.C.

(57) ABSTRACT

A composite substrate having silicon substrate with excellent crystallinity and a method of manufacturing the composite substrate and an electronic component using the composite substrate are provided. A composite substrate (1) is configured to bond a support substrate (10) having electrical insulating property, and a silicon substrate (20) which is overlaid on the support substrate (10). The semiconductor substrate (20) of the composite substrate (1) includes a plurality of first regions (20x) in which a device function unit functioning as a semiconductor device is formed, and a second region (20y) located between these first regions (20x). In the semiconductor substrate (20) of the composite substrate (1), an amorphous form (22) containing silicon and a metal is present in the second region (20y).

8 Claims, 8 Drawing Sheets

(51) Int. Cl.
*H01L 29/02* (2006.01)
*H01L 21/20* (2006.01)
*H01L 21/02* (2006.01)

(56) References Cited

U.S. PATENT DOCUMENTS

2007/0072391 A1* 3/2007 Pocas et al. .................. 438/455
2009/0001521 A1* 1/2009 Yonekawa .................... 257/620

FOREIGN PATENT DOCUMENTS

| JP | 2004510350 A | 4/2004 |
| JP | 2007535133 A | 11/2007 |
| JP | 2009010140 A | 1/2009 |

OTHER PUBLICATIONS

International Search Report, PCT/JP2012/054796, Mar. 9, 2012, 2 pp.

* cited by examiner

COMPOSITE SUBSTRATE, ELECTRONIC COMPONENT, AND METHOD OF MANUFACTURING COMPOSITE SUBSTRATE AND ELECTRONIC COMPONENT

FIELD OF INVENTION

The present invention relates to a composite substrate, an electronic component, and a method of manufacturing a composite substrate and an electronic component.

BACKGROUND

In recent years, in order to achieve performance improvement of a semiconductor device, a technique for decreasing parasitic capacitance has been developed. As a technique for decreasing parasitic capacitance, a silicon-on-sapphire (SOS) structure is known. As a method of forming the SOS structure, for example, a technique disclosed in Japanese Unexamined Patent Publication JP-A 10-12547 (1998) is known.

SUMMARY

However, in the technique disclosed in JP-A 10-12547 (1998), lattice defect occurs in silicon due to a difference in a lattice structure between silicon and sapphire.

The invention has been devised in consideration of the above-described situation, and an object of the invention is to provide a composite substrate having silicon substrate with excellent crystallinity and a method of manufacturing the composite substrate and an electronic component using the composite substrate.

A composite substrate of the invention includes a support substrate having electrical insulating property, and a silicon substrate which is overlaid on the support substrate, wherein the silicon substrate comprises a plurality of first regions and a second region located between the plurality of first regions, and an amorphous form containing silicon and a metal is present in a main surface of the second region which is located at a side of the support substrate.

A first method of manufacturing a composite substrate of the invention includes bonding a main surface of a silicon substrate onto a support substrate having electrical insulating property through a metal layer, and heating the support substrate and the silicon substrate bonded with each other to form an amorphous form containing silicon and a metal which forms the metal layer on a main surface of the silicon substrate which is located at a side of the support substrate.

A second method of manufacturing a composite substrate of the invention includes forming a dent portion in a second region between a plurality of first regions on a main surface of a silicon substrate, forming a metal layer on at least one of the main surface of the silicon substrate and a support substrate having electrical insulating property, bonding the main surface of the silicon substrate onto the support substrate through the metal layer, and heating the support substrate and the silicon substrate bonded with each other configured for aggregating the metal layer in the dent portion and forming an amorphous form containing silicon and a metal which forms the metal layer on the main surface of the silicon substrate which is located at a side of the support substrate.

A method of manufacturing an electronic component of the invention includes forming a device function unit functioning as a semiconductor device in the plurality of the first regions of the composite substrate, and dividing the composite substrate into regions including at least one of the device function unit.

An electronic component of the invention includes a support chip and a silicon chip located on the support chip, wherein the silicon chip has a first region in which a device portion functioning as a semiconductor device is provided and a second region which is located surrounding the first region, and an amorphous form containing silicon and a metal is present in a main surface of the second region which is located at a side of the support chip.

A method of manufacturing an electronic component of the invention includes forming a device function unit functioning as a semiconductor device in the plurality of the first regions of the composite substrate, and dividing the composite substrate into regions including at least one of the device function unit.

According to the invention, it is possible to provide a composite substrate and an electronic component having a silicon substrate with excellent crystallinity, and a method of manufacturing the composite substrate and the electronic component.

DETAILED DESCRIPTION OF THE PREFERRED EMBODIMENTS

First Embodiment of Composite Substrate

Figure 1:
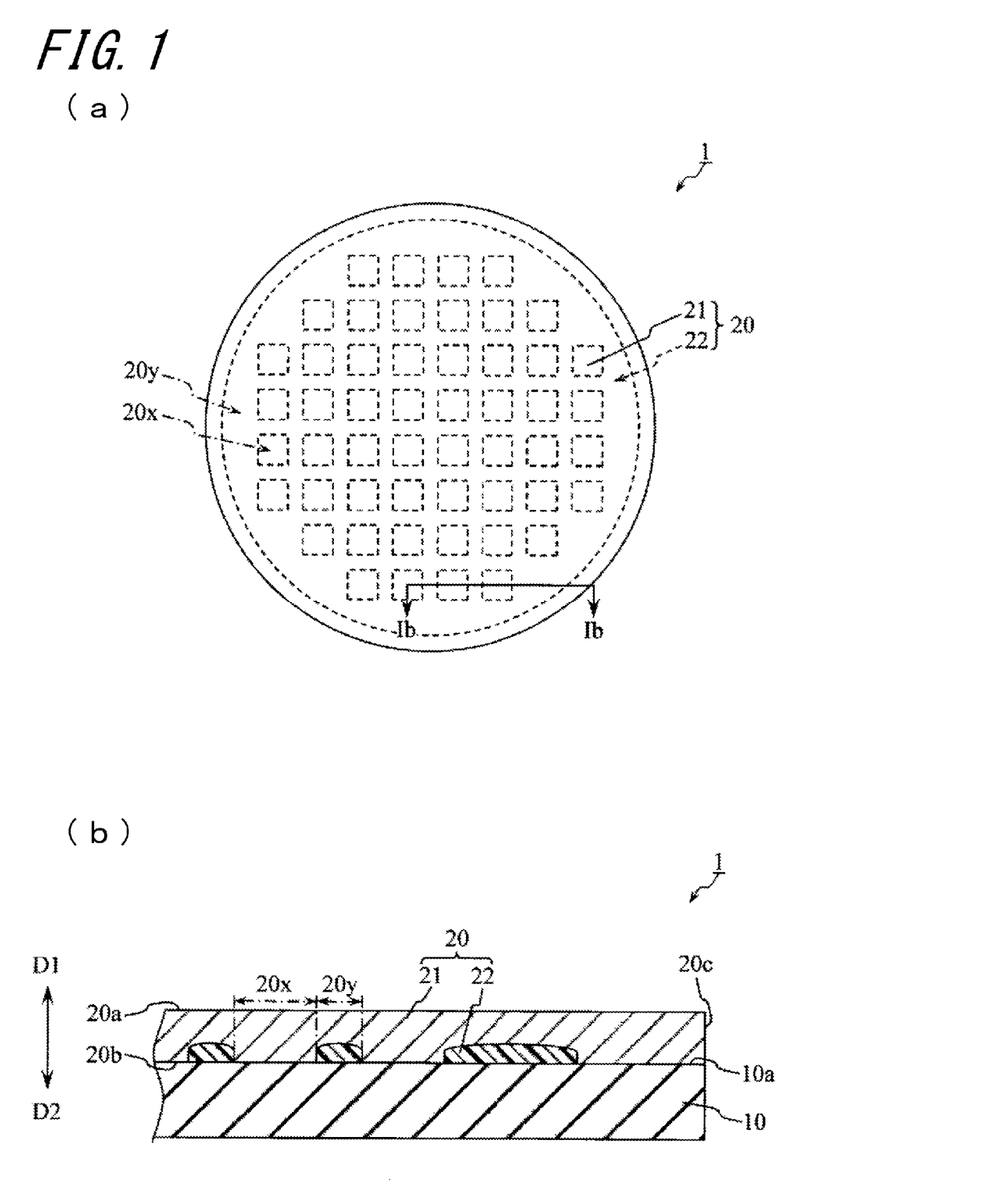
FIG. 1(a) is a plan view showing the schematic configuration of an embodiment of a composite substrate according to the invention.
FIG. 1(b) is a sectional view taken along the line Ib-Ib of FIG. 1(a)

A composite substrate 1 which is an example of an embodiment of a composite substrate of the invention will be described referring to the drawings. The composite substrate 1 shown in FIG. 1 includes a support substrate 10 and a silicon substrate 20.

The support substrate 10 is a support member of the silicon substrate 20 as a semiconductor layer. It should suffice that the support substrate 10 is electrical insulating, and in this embodiment, the support substrate 10 is formed of aluminum oxide single crystal (hereinafter, referred to as "sapphire"). For the support substrate 10, a silicon carbide substrate or the like may also be used. The silicon substrate 20 is overlaid on the main surface (hereinafter, referred to as "top surface 10a") of the support substrate 10 in a D1 direction. In other words, the silicon substrate 20 is supported and bonded directly to the top surface 10a of the support substrate 10. The thickness of the support substrate 10 is, for example, in a range of 400 to 800 [μm].

A device function unit which functions as a semiconductor device is formed in a part of the silicon substrate 20. In this embodiment, silicon single crystal is used as the silicon substrate 20. The thickness of the silicon substrate 20 is, for example, in a range of 50 to 300 [nm]. In the silicon substrate 20, a region where a device function unit is formed is referred to as a first region 20x, and a region other than the first region 20x is referred to as a second region 20y. The first regions 20x are arranged in a matrix, and part of the second region 20y located between the first regions 20x spreads in a lattice shape. The second region 20y can be used for splitting or cutting when the composite substrate 1 is divided into desired first regions 20x. The formation and arrangement of the first regions 20x are not limited to this embodiment, and are appropriately selected. The shape of the second region 20y is appropriately selected according to the shape and arrangement of the first regions 20x.

The silicon substrate 20 includes a main portion 21 and an amorphous form 22. The main portion 21 is a region which occupies the main part of the silicon substrate 20, and is formed of silicon single crystal (hereinafter, simply referred to as "silicon"). The main portion 21 is primarily located in the first region 20x. The amorphous form 22 is a region where the main portion 21 and a metal material are mixed. Examples of the metal material contained in the amorphous form 22 include iron (Fe), nickel (Ni), manganese (Mn), chromium (Cr), and aluminum (Al). The amorphous form 22 is primarily located in the second region 20y. That is, the amorphous form 22 is formed between the first regions 20x. The amorphous form 22 faces the main surface (hereinafter, referred to as "lower main surface 20b") of the silicon substrate 20 in a D2 direction.

The amorphous form 22 has a bond of an element forming the main portion 21 and a single metal material. When the main portion 21 is Si, and the metal material is Fe, the amorphous form 22 has a Fe—Si bond. The amorphous form 22 is not present on the lower main surface 20b, and is present only in the second region 20y. That is, the amorphous form 22 is aggregated, thereby reducing the diffusion depth compared to uniform diffusion. Accordingly, it is possible to suppress the diffusion of the metal material to the silicon substrate 20.

The amorphous form 22 can be specified by an electronic energy loss spectroscopy (EELS) or the like.

It is preferable that the interval between a plurality of first regions 20x is equal to or greater than 100 [nm]. More preferably, the interval is equal to or greater than 300 [nm]. When a metal is present between a region directly below a portion where a device function unit is formed and the support substrate 10, device characteristics may be deteriorated. Meanwhile, the interval between the plurality of first regions 20x is set as described above, it is possible to eliminate a metal which affects a device function unit to be formed in the first region 20x. The interval between the plurality of first regions 20x will be described below.

The amorphous form 22 is formed at an inner portion with reference to different surfaces of the silicon substrate 20 except the lower main surface 20b of the silicon substrate 20, that is, a main surface (hereinafter, referred to as "upper main surface 20a") and a lateral surface 20c of the silicon substrate 20 in the D1 and D2 directions. In other words, the main portion 21 faces the upper main surface 20a and the lateral surface 20c of the silicon substrate 20. That is, the exposed region of the silicon substrate 20 has the same composition. For this reason, in the silicon substrate 20, an effective process can be selected from various processes relating to silicon and appropriately used.

The amorphous form 22 is arranged surrounding the first region 20x. The adhesion strength of sapphire and the amorphous form 22 is greater than the adhesion strength of sapphire and silicon. The amorphous form 22 faces the lower main surface 20b of the silicon substrate 20, thereby increasing the adhesion strength of bonding of the support substrate 10 and the silicon substrate 20. In the composite substrate 1, even after the composite substrate 1 is divided as a semiconductor device, it is possible to satisfactorily adhere the support substrate 10 and the silicon substrate 20. The configuration of this embodiment may be restated as the individual first region 20x being divided by the amorphous form 22.

It is preferable that the roughness of the bonded surfaces of the support substrate 10 and the silicon substrate 20 is small, and for example, a mean roughness Ra (arithmetic mean roughness) is smaller than 10 [nm]. The mean roughness Ra decreases, thereby reducing pressure to be applied when bonding. In particular, Ra is equal to or smaller than 1 [nm], thereby performing bonding with very small pressure.

Method of Manufacturing Composite Substrate and Semiconductor Device

Figure 2:
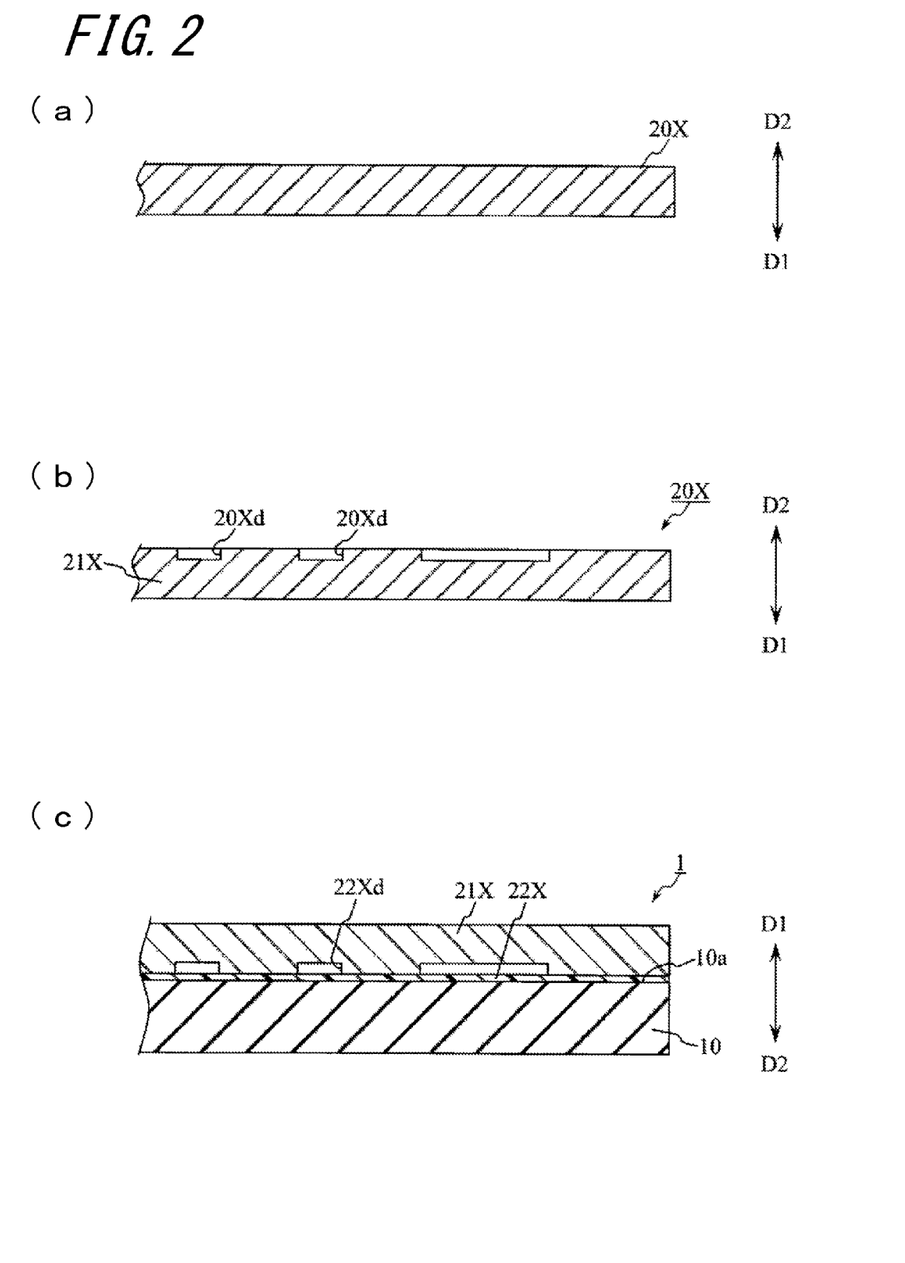
FIGS. 2(a) to 2(c) are schematic views showing an embodiment of a process for manufacturing a composite substrate and a semiconductor device according to the invention.
Figure 3:
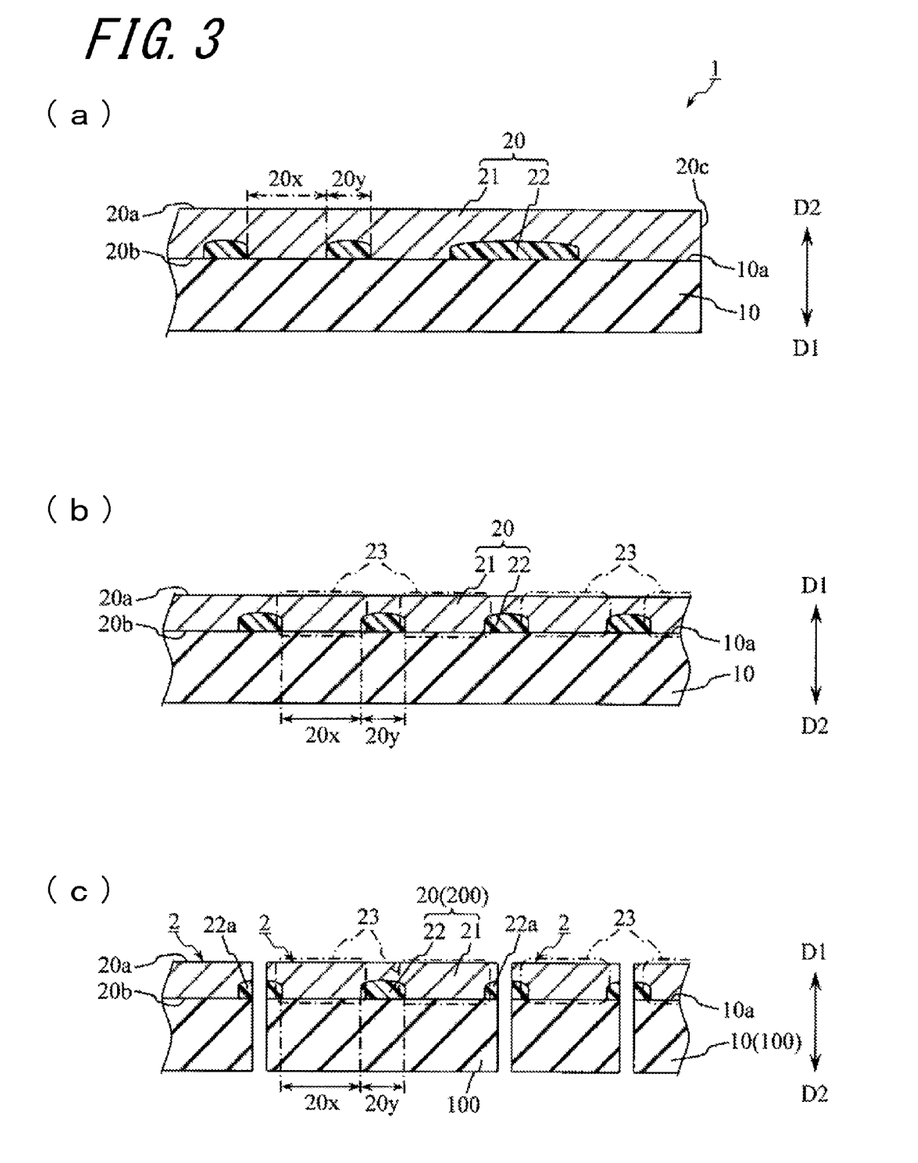
FIGS. 3(a) to 3(c) are schematic views showing a process subsequent to FIG. 2.
Figure 4:
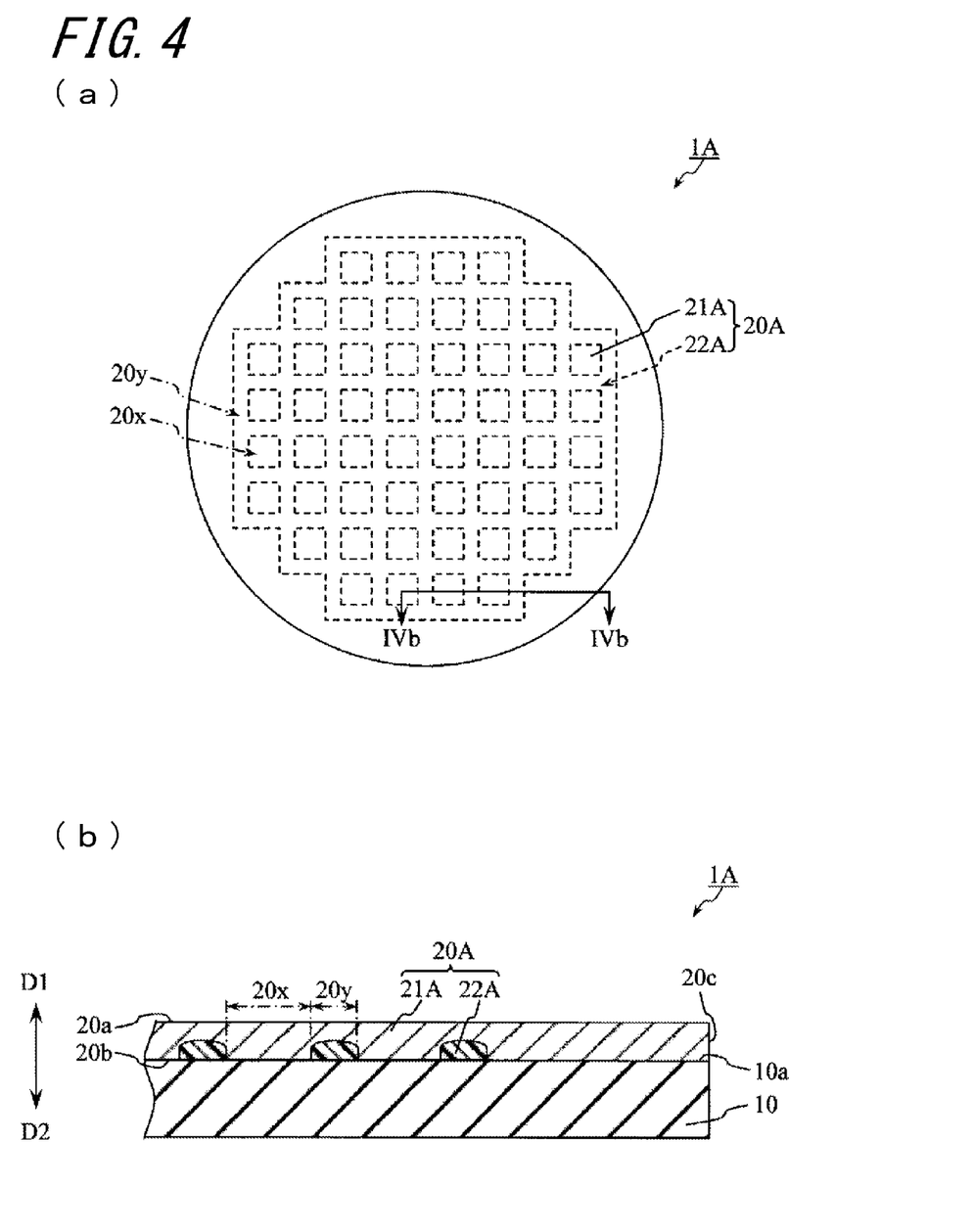
FIG. 4(a) is a plan view showing the schematic configuration of a modified example of the composite substrate shown in FIG. 1.
FIG. 4(b) is a sectional view taken along the line IVb-IVb of FIG. 4(a)

An example of an embodiment of a method of manufacturing a composite substrate and a semiconductor device of the invention will be described referring to FIGS. 2 to 4.

First, as shown in FIG. 2(a), a semiconductor substrate 20X which becomes the silicon substrate 20 is prepared. In this embodiment, a silicon substrate is adopted as the semiconductor substrate 20X.

Next, as shown in FIG. 2(b), in the main surface of the semiconductor substrate 20X, dent portions 20Xd are formed in one main surface which becomes the lower main surface 20b of the silicon substrate 20. The dent portion 20Xd is formed in a region which becomes the second region 20y. As a method of forming the dent portion 20Xd, for example, a method in which silicon is partially oxidized using a photomask to selectively remove silicon oxide, or a desired portion is etched using a mask is used. As the oxidization, for example, various methods, such as thermal oxidization, solution oxidization, and the like, are adopted. As etching, a chemical method or a physical method, such as an ion beam, is used. As the mask, for example, a metal mask, a photomask, and the like are known and appropriately selected according to an etching method.

It should suffice that the depth of the dent portion 20Xd is, for example, about 10 [nm]. It is preferable that the depth of the dent portion 20Xd is smaller than the difference between the thickness in the first region 20x and the thickness of a device function unit 23 described below.

Next, as shown in FIG. 2(c), the support substrate 10 and the semiconductor substrate 20X are bonded together through a metal layer 22X. As the bonding method, a method in which the surfaces to be bonded are activated to perform bonding, and a method in which an electrostatic force is used to perform bonding are used. As the method of activating the surfaces, for example, a method in which an ion beam is irradiated in vacuum to etch and activate the surfaces, or the like is used. It is preferable that the bonding is performed at normal temperature. During the bonding, a method in which a resinbased adhesive is not used is adopted, and bonding is performed by solid state bonding using an atomic force or the like.

As the metal material which forms the metal layer 22X, for example, Fe, Cr, Ni, Mn, Al, and Cu may be used alone or in combination. The metal material is supplied to the activated surfaces by activating a metal supply source in a bonding apparatus simultaneously with irradiation of an ion beam during bonding. The thickness of the metal layer 22X is not particularly limited, and is, for example, equal to or smaller than 5 [nm]. The metal layer 22X may be in a state where metal elements (particles) are stuck, that is, in a network shape. The metal layer 22X is present on the bonding interface when the surfaces are activated and bonded, and in general SOI, since thermal compression bonding is performed through an oxide, it is not even necessary to provide the metal layer.

Next, the semiconductor substrate 20X is thinned so as to have a desired thickness. As the thinning method, various methods, such as abrasive-grain polishing, chemical etching, and ion beam etching, can be adopted, and multiple methods may be combined.

The surface of the semiconductor substrate 20X may be smoothened by precise etching along with the thinning. As etching means using precise etching, for example, dry etching is used. The dry etching includes dry etching by chemical reaction and dry etching by physical collision. As the dry etching using chemical reaction, dry etching using reactive gas, ions and ion beams, or radicals is used. As etching gas which is used for reactive ions, sulfur hexafluoride ($SF_6$), carbon tetrafluoride ($CF_4$), or the like is used. As dry etching by physical collision, dry etching using ion beams is used. The dry etching using ion beams includes a method using a gas cluster ion beam (GCIB). The semiconductor substrate 20X is scanned with a movable stage while etching a narrow region using the etching means, thereby satisfactorily performing precise etching even on a large-area material substrate.

Next, the support substrate 10 and the semiconductor substrate 20X bonded with each other are heated for aggregating the metal layer 22X in the dent portion 20Xd. The aggregated metal layer 22X is mixed with silicon of the semiconductor substrate 20X, and thus the amorphous form 22 is formed. Since silicon of the semiconductor substrate 20X is used in forming the amorphous form 22, the shape of the dent portion 20Xd of the semiconductor substrate 20X changes. That is, a corner portion or a smoothed portion constituting the dent portion 20Xd having a rectangular sectional shape is eliminated. The dent portion 20Xd has a shape according to the shape of the amorphous form 22 as an aggregate.

The temperature in the heating condition is equal to or higher than the melting point of each metal, and more preferably, is equal to or higher than an eutectic temperature of the element forming the semiconductor substrate 20X and the metal material. For example, in this embodiment, a state equal to or higher than 500° C. is maintained for 30 minutes or more, thereby aggregating the metal layer in the dent portion 20Xd. An atmosphere during heating is not particularly limited, and any one of air, oxygen, nitrogen, inert gas, reductive gas, and the like may be selected.

As in this embodiment, when the support substrate 10 and the semiconductor substrate 20X are bonded together in vacuum by activating and bonding the surfaces, it is inferred that a cavity is partially generated in the bonding interface. In particular, in this example, since the dent portion 20Xd is provided, in normal-temperature bonding by activating the bonded surfaces, a cavity is generated in the bonding interface. It is considered that, through heating after bonding, the metal is molten, moved so as to bury the cavity, and aggregated at a predetermined place. That is, in this embodiment, the dent portion 20Xd is provided at an intended position, thereby controlling the aggregate position of the metal.

As described above, it is possible to obtain the composite substrate 1 in which the silicon substrate 20 is bonded onto the support substrate 10 having electrical insulation. The silicon substrate 20 of the composite substrate 1 includes a plurality of first regions 20x where a device function unit functioning as a semiconductor device is formed, and the second region 20y which is located between the first regions 20x. In the semiconductor substrate 20 of the composite substrate 1, the amorphous form 22 of silicon and metal is provided in the second region 20y.

Next, as shown in FIG. 3(b), the device function unit 23 is formed from the upper main surface 20a side of the obtained composite substrate 1. The device function unit 23 is formed in an arbitrary first region 20x. As the device function unit 23, various semiconductor device structures are used. In FIG. 3(a) and FIGS. 3(b) and 3(c), different locations are shown.

Next, as shown in FIG. 3(c), the composite substrate 1 in which the device function unit 23 is formed is divided, and thus the electronic component 2 is manufactured. When dividing the composite substrate 1 into the electronic component 2, at least one of the device function unit 23 is included in one electronic component 2. In other words, the plurality of first regions 20x, and consequently, a plurality of device function units 23 may be included in one electronic component 2.

At least one of the amorphous form 22 and the amorphous form 22a obtained by dividing the amorphous form 22 is included in one electronic component 2. The amorphous form 22 or the divided amorphous form 22a is included in one electronic component 2, thereby satisfactory adhering a support chip 100 and a silicon chip 200 when using as the electronic component 2.

In this way, it is possible to manufacture the electronic component 2 having the device function unit 23.

The invention is not limited to the foregoing embodiment, and it should be noted that various variations may be made without departing from the scope of the invention.

For example, although in the silicon substrate 20, the amorphous form 22 is formed from the edge of the first region 20x to the edge of the main portion 21, the amorphous form 22 is not limited to this shape. For example, as a silicon substrate 20A shown in FIG. 4, an amorphous form 22A may surround the edge of the first region 20x.

Figure 5:
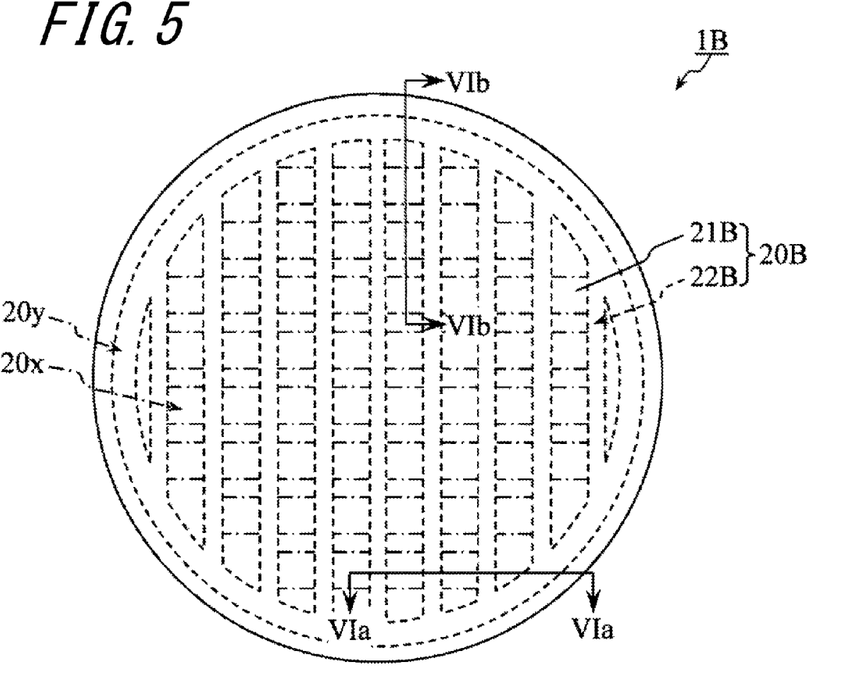
FIG. 5 is a plan view showing the schematic configuration of a modified example of the composite substrate shown in FIG. 1.
Figure 6:
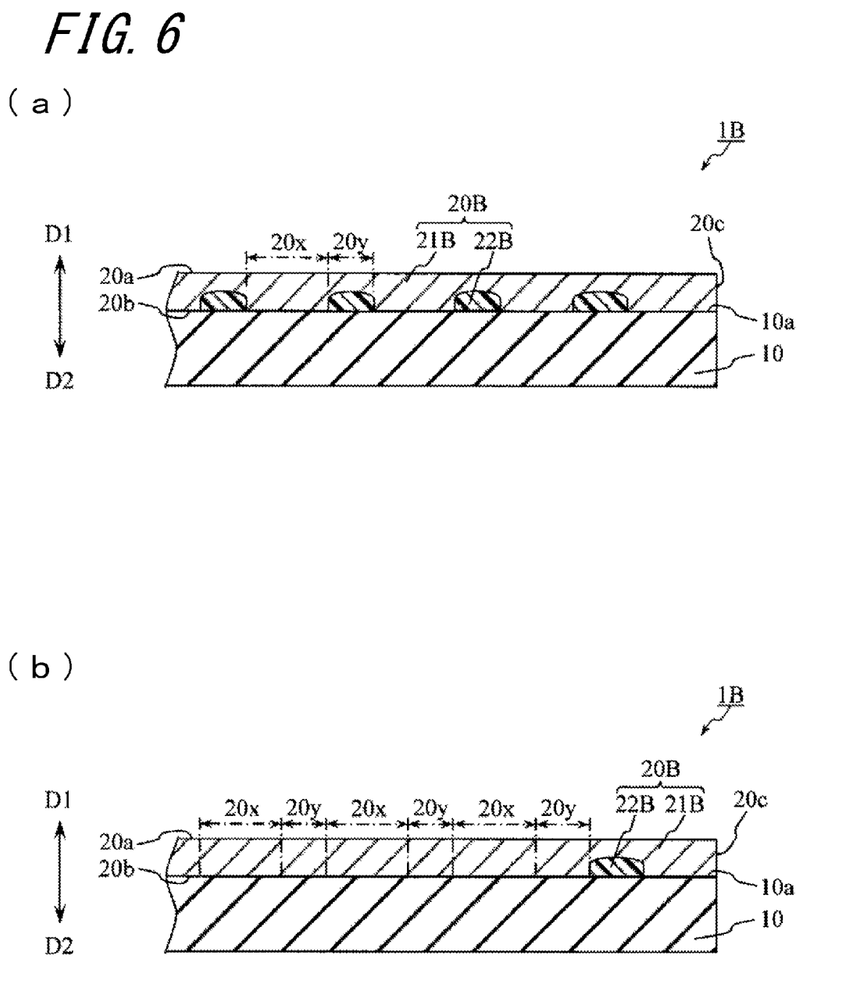
FIG. 6(a) is a sectional view taken along the line VIa-VIa of FIG. 5.
FIG. 6(b) is a sectional view taken along the line VIb-VIb of FIG. 5.
Figure 7:
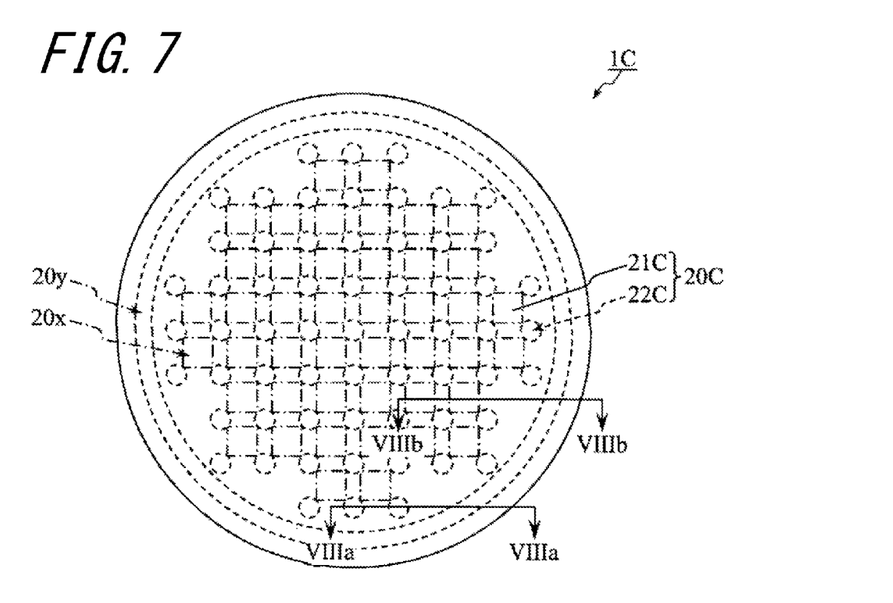
FIG. 7 is a plan view showing the schematic configuration of a modified example of the composite substrate shown in FIG. 1.
Figure 8:
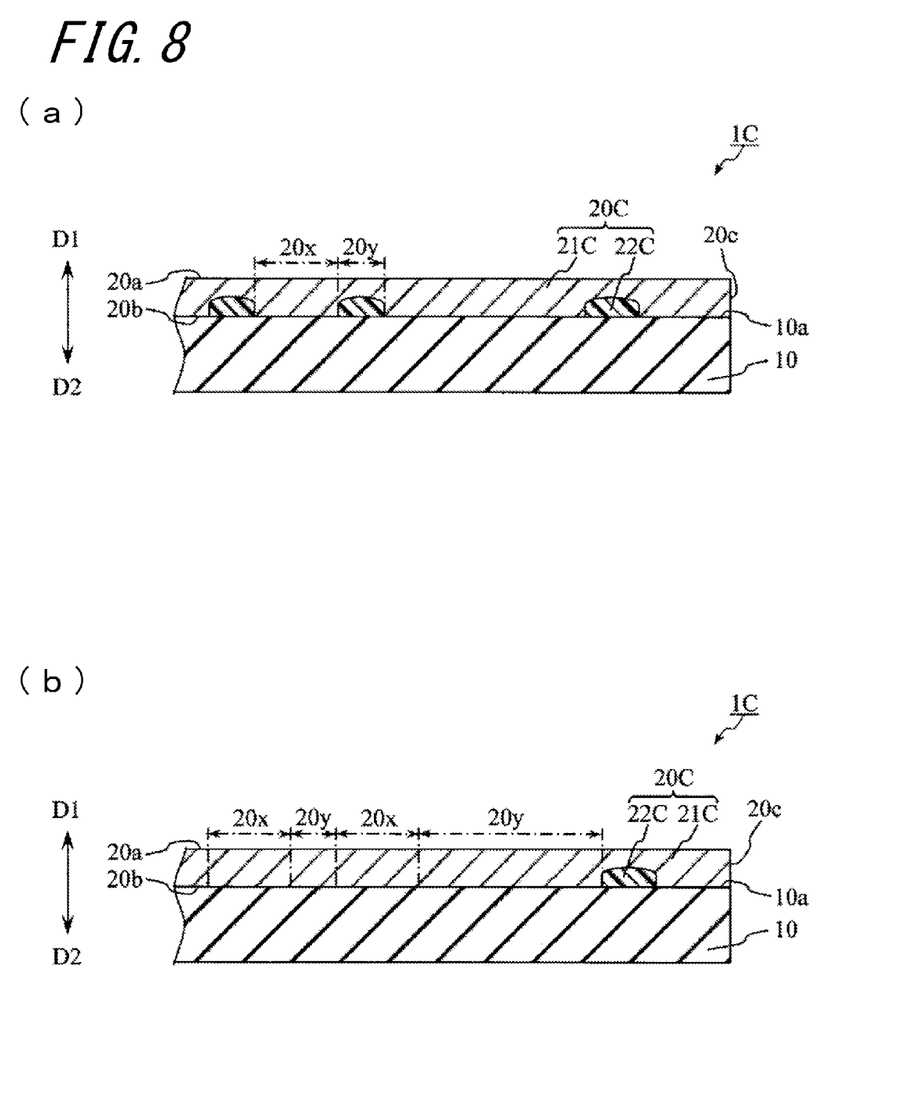
FIG. 8(a) is a sectional view taken along the line VIIIa-VIIIa of FIG. 7.
FIG. 8(b) is a sectional view taken along the line VIIIb-VIIIb of FIG. 7.

In the silicon substrate 20, although the amorphous form 22 surrounds the first region 20x in a lattice shape, the amorphous form 22 is not limited to this shape, for example, as a silicon substrate 20B shown in FIG. 5, a pair of amorphous forms 22B which extend along the first region 20x may be provided. As a silicon substrate 20C shown in FIG. 6, amorphous forms 22C may be provided at four corners of the first region 20x.

In the above-described manufacturing method, although the metal layer 22X is aggregated to form the amorphous form 22, a part of the metal layer 22X may form the amorphous form 22, and the other part may be left as the metal layer 22X. A part which is left as the metal layer 22X may not have uniform concentration, and the concentration distribution of the metal may be generated.

Modified Example of Method of Manufacturing Composite Substrate

In the above-described manufacturing method, as shown in FIG. 2(b), although the dent portion 20Xd is formed in the silicon substrate 20, and the metal is aggregated in the dent portion 20Xd, the dent portion 20Xd may not be provided. In this case, the thickness (corresponding to the supply metal amount) of the metal layer 22X to be formed in FIG. 2(c) is adjusted, thereby aggregating the metal layer 22X at a given interval according to the supply metal amount. Similarly, the size of the amorphous form 22 depends on the supply metal amount.

For example, when the metal supply amount is $1 \times 10^{16}$ [atoms/cm$^3$], the interval of the amorphous form 22 can be about 100 [nm].

From the relationship between the metal supply amount and the interval of the amorphous form 22, it is preferable that the interval of the amorphous form 22 is smaller than 100 [nm], because in this case it is possible to suppress the adverse effect of the size of the amorphous form 22 on the operation characteristics as the electronic component 2. It is preferable that the interval of the amorphous form 22 is equal to or greater than 300 [nm], because in this case it is possible to further reduce the size of the amorphous form 22 and to suppress the adverse effect on the operation characteristics as the electronic component 2. Specifically, it is preferable that the size of the amorphous form 22 in the thickness direction is smaller than the size obtained by subtracting the thickness required to form the semiconductor device function unit 23 from the thickness of the thickness silicon substrate 20.

REFERENCE SIGNS LIST

1, 1A to 1C: Composite substrate
2: Electronic component
10: Support substrate
10a: Top surface
20, 20A to 20C: Semiconductor layer
20a: Upper main surface
20b: Lower main surface
20c: Lateral surface
20x: First region
20y: Second region
20X: Semiconductor substrate
20Xd: Dent portion
21, 21A to 21C: Main portion
22, 22A to 22C: Amorphous form
22a: Divided amorphous form
22X: Metal layer
23: Device function unit

What is claimed is:

1. A composite substrate, comprising:
a support substrate having electrical insulating property; and
a silicon substrate which is overlaid on the support substrate, wherein
the silicon substrate comprises a plurality of first regions and a second region located between the plurality of first regions,
an amorphous form is present in the second region of the silicon substrate, the amorphous form being an aggregate containing silicon and a metal and including a surface located on the support substrate, and
a cross-sectional shape of the amorphous form is curved except the surface located on the support substrate.

2. The composite substrate according to claim 1,
wherein the support substrate is single crystal predominantly composed of aluminum oxide.

3. The composite substrate according to claim 1,
wherein the amorphous form surrounds the plurality of first regions.

4. The composite substrate according to claim 1,
wherein the amorphous form is configured such that only the surface located on the support substrate is situated in surfaces of the silicon substrate.

5. The composite substrate according to claim 1,
wherein the amorphous form is located at an inner portion with reference to a lateral surface of the silicon substrate.

6. The composite substrate according to claim 1,
wherein the plurality of first regions are arranged at an interval equal to or greater than 100 nm.

7. The composite substrate according to claim 1,
wherein the plurality of first regions are arranged at an interval equal to or greater than 300 nm.

8. An electronic component, comprising:
a support chip having electrical insulating property; and
a silicon chip located on the support chip, wherein
the silicon chip has a first region in which a device portion functioning as a semiconductor device is provided and a second region which is located surrounding the first region,
an amorphous form is present in the second region of the support chip, the amorphous form being an aggregate containing silicon and a metal and including a first surface located on the support chip and a second surface exposed in an entire lateral surface of the silicon chip, and
a cross-sectional shape of the amorphous form is curved except the first and second surfaces.

* * * * *